(12) United States Patent
Lee et al.

(10) Patent No.: US 10,879,049 B2
(45) Date of Patent: Dec. 29, 2020

(54) CHEMICAL VAPOR DEPOSITION TOOL AND OPERATING METHOD THEREOF

(71) Applicant: TAIWAN SEMICONDUCTOR MANUFACTURING CO., LTD., Hsinchu (TW)

(72) Inventors: Chien-Ta Lee, Yilan County (TW); Pen-Li Hung, Taichung (TW); Yu-Shan Shih, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 518 days.

(21) Appl. No.: 14/814,314

(22) Filed: Jul. 30, 2015

(65) Prior Publication Data
US 2017/0032940 A1  Feb. 2, 2017

(51) Int. Cl.
*C23C 16/44* (2006.01)
*H01J 37/32* (2006.01)

(52) U.S. Cl.
CPC .... *H01J 37/32449* (2013.01); *C23C 16/4405* (2013.01); *H01J 37/32357* (2013.01); *H01J 37/32853* (2013.01); *H01J 2237/327* (2013.01); *H01J 2237/335* (2013.01); *H01J 2237/3321* (2013.01)

(58) Field of Classification Search
CPC ........... H01J 37/32449; H01J 37/32357; H01J 37/32853; H01J 2237/327; H01J 2237/3321; H01J 2237/335; H01J 37/32862; C23C 16/4405
USPC .......... 118/723 MW, 723 ME, 723 MR, 118/723 MA, 723 ER, 723 IR; 156/345.35, 345.36
See application file for complete search history.

(56) References Cited

U.S. PATENT DOCUMENTS

| | | | | |
|---|---|---|---|---|
| 5,082,517 A | * | 1/1992 | Moslehi | H01J 37/32266 118/723 E |
| 5,453,124 A | * | 9/1995 | Moslehi | C23C 16/45561 118/715 |
| 6,055,927 A | * | 5/2000 | Shang | C23C 16/4405 118/715 |
| 6,450,116 B1 | * | 9/2002 | Noble | C23C 8/36 118/50.1 |
| 6,783,627 B1 | * | 8/2004 | Mahawili | C23C 8/36 118/723 IR |
| 2009/0212014 A1 | * | 8/2009 | Ohata | H01L 21/67109 216/58 |

* cited by examiner

*Primary Examiner* — Rudy Zervigon
(74) *Attorney, Agent, or Firm* — Maschoff Brennan

(57) ABSTRACT

A chemical vapor deposition (CVD) tool includes a processing chamber, a remote plasma system, a first gas source, a second gas source, a first gas passage and a second gas passage. The remote plasma system is connected to the processing chamber. The first gas passage connects the first gas source, the remote plasma system and the processing chamber. The second gas passage connects the second gas source and the processing chamber, and bypasses the remote plasma system.

20 Claims, 2 Drawing Sheets

CHEMICAL VAPOR DEPOSITION TOOL AND OPERATING METHOD THEREOF

BACKGROUND

The present disclosure relates to chemical vapor deposition (CVD) tools.

Chemical vapor deposition (CVD) is a chemical process used in the semiconductor industry to produce thin films. In CVD, the wafer (substrate) is exposed to one or more volatile precursors, which react and/or decompose on the substrate surface to produce the thin film. Microfabrication processes widely use CVD to deposit materials in various forms, including: monocrystalline, polycrystalline, and amorphous. These materials include: silicon, silicon oxide, silicon-germanium, tungsten, silicon carbide, silicon nitride, silicon oxynitride, titanium nitride, and high-k dielectrics.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
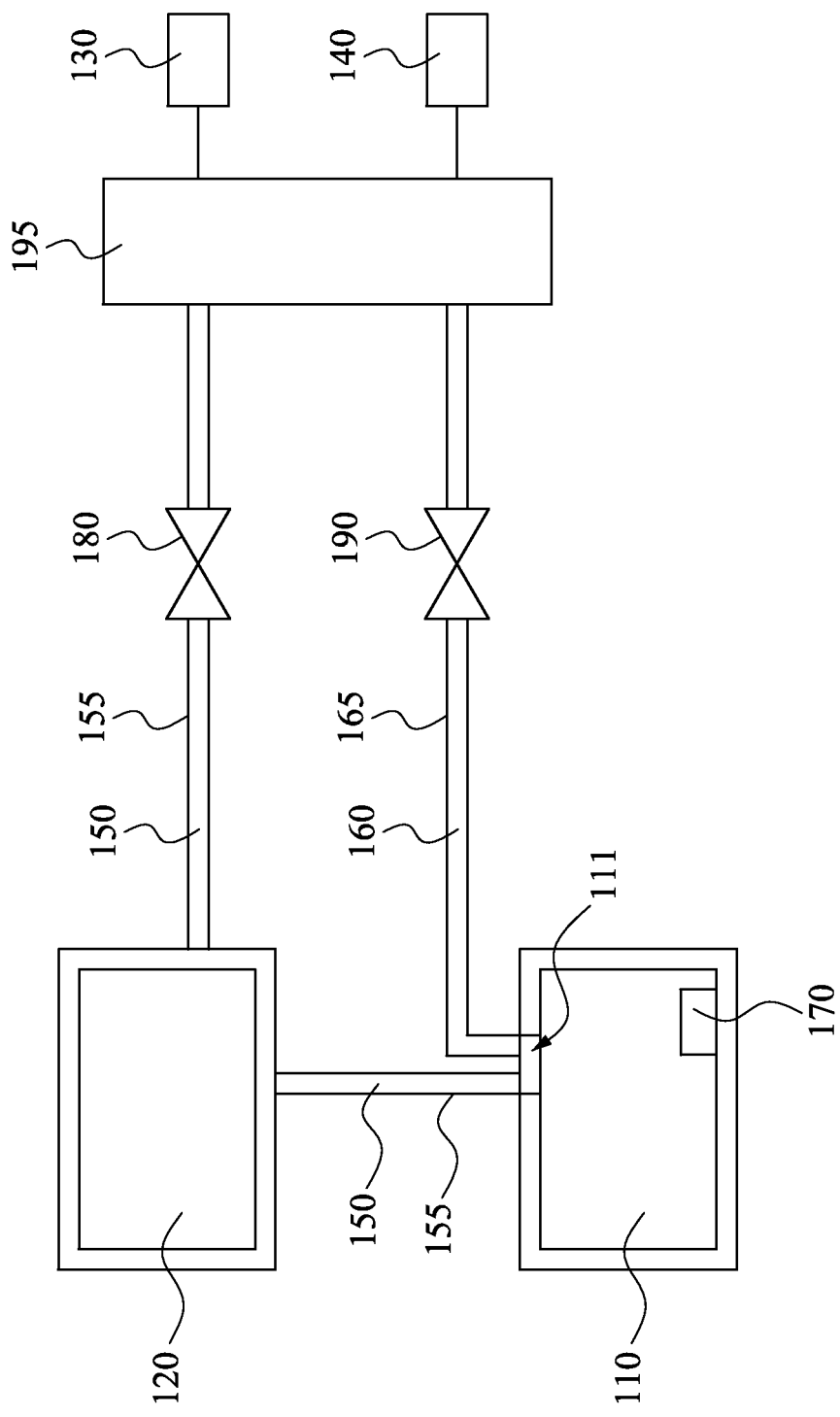
FIG. 1 is a schematic diagram of a chemical vapor deposition (CVD) tool in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, operations, operations, elements, and/or components, but do not preclude the presence or addition of one or more other features, regions, integers, operations, operations, elements, components, and/or groups thereof.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference is made to FIG. 1. FIG. 1 is a schematic diagram of a chemical vapor deposition (CVD) tool 100 in accordance with some embodiments of the present disclosure. As shown in FIG. 1, the chemical vapor deposition tool 100 includes a processing chamber 110, a remote plasma system (RPS) 120, a first gas source 130, a second gas source 140, a first gas passage 150 and a second gas passage 160. The remote plasma system 120 is connected to the processing chamber 110. The first gas passage 150 connects the first gas source 130, the remote plasma system 120 and the processing chamber 110. The second gas passage 160 connects the second gas source 140 and the processing chamber 110, and bypasses the remote plasma system 120. In practical applications, the processing chamber 110 is where the process of chemical vapor deposition takes place.

To be more specific, as shown in FIG. 1, the chemical vapor deposition tool 100 includes a first duct 155 and a second duct 165. The first duct 155 is connected to the first gas source 130. The remote plasma system 120 is connected to the first duct 155. The second duct 165 is connected to the second gas source 140, in which the processing chamber 110 is connected to the second duct 165. In other words, the first duct 155 defines the first gas passage 150 therein while the second duct 165 defines the second gas passage 160 therein. In some embodiments, the inner diameter of the first duct 155 ranges from about 0.01 inches to about 2 inches, and the inner diameter of the second duct 165 ranges from about 0.01 inches to about 2 inches.

As mentioned above, the second gas passage 160 connects the second gas source 140 and the processing chamber 110, and bypasses the remote plasma system 120. In other words, in the structural point of view, a fluid passage from the second gas source 140 to the processing chamber 110 through the second duct 165 does not pass through the remote plasma system 120.

In some embodiments, the first gas source 130 is a cleaning gas source. The cleaning gas source is configured to provide cleaning gas to the remote plasma system 120 through the first gas passage 150. In general, the cleaning gas is corrosive. Furthermore, the remote plasma system 120 is configured to covert the cleaning gas to a cleaning plasma and then supply the cleaning plasma into the processing chamber 110 through the first gas passage 150. As a result, the processing chamber 110 can be cleaned by the corrosive cleaning plasma after the process of chemical vapor deposition takes place. Consequently, the residual film remained in the processing chamber 110 after the process of chemical vapor deposition is removed. In general, the cleaning plasma is the cleaning gas in which a part of the atoms or molecules are ionized.

Furthermore, as shown in FIG. 1, the remote plasma system 120 is downstream connected to the first gas source 130 through the first duct 155, and the processing chamber 110 is downstream connected to the remote plasma system 120. In this way, the cleaning gas flows in the sequential order from the first gas source 130 to the remote plasma system 120 through the first duct 155 first, and then supplied to the processing chamber 110 after being converted to the cleaning plasma by the remote plasma system 120.

On the other hand, the second gas source 140 is a processing gas source. The processing gas source is configured to provide processing gas to the processing chamber 110 through the second gas passage 160. The processing gas is utilized for forming a film on a substrate (not shown) in the processing chamber 110. In some embodiments, the substrate is a wafer. Moreover, in practical applications, the processing gas may include molecules containing fluoride atoms or aluminum atoms.

Furthermore, as shown in FIG. 1, the processing chamber 110 is downstream connected to the second gas source 140 through the second duct 165. In this way, the processing gas flows in the sequential order from the second gas source 140 to the processing chamber 110 through the second duct 165.

In practical applications, when the processing chamber 110 of the chemical vapor deposition tool 100 is to be cleaned, the cleaning gas source (i.e., the first gas source 130) provides the cleaning gas to the remote plasma system 120 through the first gas passage 150. Afterwards, the remote plasma system 120 coverts the cleaning gas to the cleaning plasma and then supply the cleaning plasma into the processing chamber 110 through the first gas passage 150 for cleaning. At this point, the processing gas source (i.e., the second gas source 140) stops providing the processing gas to the processing chamber 110 through the second gas passage 160.

On the other hand, when the process of chemical vapor deposition is to take place in the processing chamber 110 of the chemical vapor deposition tool 100, the processing gas source (i.e., the second gas source 140) provides the processing gas to the processing chamber 110 through the second gas passage 160. At this point, the cleaning gas source (i.e., the first gas source 130) stops providing the cleaning gas to the remote plasma system 120 through the first gas passage 150. To be more specific, few or no cleaning plasma is supplied into the processing chamber 110 through the first gas passage 150 when the process of chemical vapor deposition is taking place in the processing chamber 110.

In other words, the supply of the cleaning gas to the remote plasma system 120 through the first gas passage 150 and the supply of the processing gas to the processing chamber 110 through the second gas passage 160 are expressly separated. As a result, the flow of the processing gas into the remote plasma system 120 is avoided. Consequently, the probability that the processing gas gets into the remote plasma system 120 and thus causing the existence of residue of the processing gas in the remote plasma system 120 is minimized.

In some embodiments, however, during the process of the chemical vapor deposition in the processing chamber 110 of the chemical vapor deposition tool 100, the cleaning plasma is also supplied into the processing chamber 110 through the first gas passage 150 from the remote plasma system 120. For instance, when a film is to be formed on a substrate on which there is a plurality of tiny grooves, apart from the processing gas to be utilized in the processing chamber 110, the cleaning plasma is also utilized. The cleaning plasma works to remove the excessive portions of the film formed by the processing gas on the substrate especially at the tiny grooves. In this way, the thickness of the film formed on the substrate is controlled and the quality of the film formed on the substrate is increased. In practice, the size of the tiny grooves may be in the order of 10 nanometers, for example, 20-30 nanometers. However, this does not intend to limit the present disclosure.

As mentioned above, the probability that the processing gas gets into the remote plasma system 120 and thus causing the existence of residue of the processing gas in the remote plasma system 120 is minimized. In this way, there are at least two consequences. Firstly, the probability that the remote plasma system 120 to be contaminated by the processing gas is minimized. Therefore, the working life of the remote plasma system 120 is elongated and thus the maintenance cost for the chemical vapor deposition tool 100 is accordingly reduced. Secondly, in the process of chemical vapor deposition in the processing chamber 110 where both the processing gas and the cleaning gas are utilized, the minimized probability of the existence of residue of the processing gas in the remote plasma system 120 means a minimized probability of the residue of the processing gas unexpectedly getting into the processing chamber 110. Therefore, the process of chemical vapor deposition in the processing chamber 110 is avoided to be affected in a destructive way. As a result, the process of chemical vapor deposition can properly take place in the processing chamber 110 and the contamination of the substrate is avoided. Consequently, the scrap rate of the substrates during the process of chemical vapor deposition is minimized and thus the production cost of the substrates is accordingly decreased.

Furthermore, in some embodiments, the chemical vapor deposition tool 100 further includes a radio frequency generating device 170. As shown in FIG. 1, the radio frequency generating device 170 is disposed in the processing chamber 110 to energize the processing gas. For instance, the radio frequency generating device 170 releases an amount of energy in the form of radio frequency in the processing chamber 110. Consequently, the processing gas absorbs the energy of radio frequency and becomes energized, which facilitates the process of chemical vapor deposition to the substrate in the processing chamber 110.

For the sake of a flow control of the cleaning gas to the remote plasma system 120, the chemical vapor deposition tool 100 further includes a first valve 180. The first valve 180 is configured to control a gas flow through the first gas passage 150. As shown in FIG. 1, the first valve 180 is disposed along the first gas passage 150. In other words, the first valve 180 is connected to the first duct 155. By adjusting the size of an orifice (not shown) inside the first valve 180, the amount of flow of the cleaning gas through the first gas passage 150 and then to the remote plasma system 120 can be accordingly controlled. For instance, when the size of the orifice inside the first valve 180 is enlarged, a greater amount of the cleaning gas is allowed to flow to the remote plasma system 120 through the first gas passage 150. On the contrary, when the size of the orifice inside the first valve 180 is reduced, a smaller amount of the cleaning gas is allowed to flow to the remote plasma system 120 through the first gas passage 150.

Similarly, for the sake of a flow control of the processing gas to the processing chamber 110, the chemical vapor deposition tool 100 further includes a second valve 190. The second valve 190 is configured to control a gas flow through the second gas passage 160. As shown in FIG. 1, the second valve 190 is disposed along the second gas passage 160. In other words, the second valve 190 is connected to the second duct 165. By adjusting the size of an orifice (not shown) inside the second valve 190, the amount of flow of the processing gas through the second gas passage 160 and then to the processing chamber 110 can be accordingly controlled. For instance, when the size of the orifice inside the second valve 190 is enlarged, a greater amount of the processing gas is allowed to flow to the processing chamber 110 through the second gas passage 160. On the contrary, when the size of the orifice inside the second valve 190 is reduced, a smaller amount of the processing gas is allowed to flow to the processing chamber 110 through the second gas passage 160.

In some embodiments, the chemical vapor deposition tool 100 further includes a gas panel 195. As shown in FIG. 1, the gas panel 195 connects the first gas source 130 and the second gas source 140, in which the first gas passage 150 and the second gas passage 160 are connected to the gas panel 195. In other words, the first duct 155 and the second duct 165 are connected to the gas panel 195. In practical applications, through the gas panel 195, the supply of the cleaning gas by the cleaning gas source (i.e., the first gas source 130) and the supply of the processing gas by the processing gas source (i.e., the second gas source 140) can be respectively controlled. For instance, as mentioned above, when the processing chamber 110 of the chemical vapor deposition tool 100 is to be cleaned, the cleaning gas source provides the cleaning gas to the remote plasma system 120 through the first gas passage 150 while the processing gas source stops providing the processing gas to the processing chamber 110 through the second gas passage 160. On the other hand, when the process of chemical vapor deposition is to take place in the processing chamber 110 of the chemical vapor deposition tool 100, the processing gas source provides the processing gas to the processing chamber 110 through the second gas passage 160 while the cleaning gas source stops providing the cleaning gas to the remote plasma system 120 through the first gas passage 150. Furthermore, when a film is to be formed on the substrate on which there are tiny grooves, apart from the processing gas to be utilized in the processing chamber 110, the cleaning plasma is also utilized. In this occasion, the cleaning gas source provides the cleaning gas to the remote plasma system 120 through the first gas passage 150 and the processing gas source also provides the processing gas to the processing chamber 110 through the second gas passage 160.

In addition, in some embodiments, the gas panel 195 can be further controlled through a preset computer program, such that the chemical vapor deposition tool 100 can be operated in an automatic manner. For example, by inputting in advance the value of the time period that the cleaning gas to be supplied to the first gas passage 150 and the value of the time period that the processing gas to be supplied to the second gas passage 160, together with the value of the time shift between the supply of the cleaning gas and the processing gas, the chemical vapor deposition tool 100 can thus be automatically operated.

In order to further enhance the degree of automation for the operation of the chemical vapor deposition tool 100, the first valve 180 and the second valve 190 can also be designed to be controlled by the computer program. In this way, the amount of flow of the cleaning gas through the first gas passage 150 to the remote plasma system 120 and the amount of flow of the processing gas through the second gas passage 160 to the processing chamber 110 can be automatically controlled.

Structurally speaking, the processing chamber 110 has a gas inlet 111. As shown in FIG. 1, the first gas passage 150 and the second gas passage 160 are connected to the gas inlet 111 of the processing chamber 110. In other words, the remote plasma system 120 and the second duct 165 are connected to the gas inlet 111 of the processing chamber 110. Through the gas inlet 111, both the cleaning gas and the processing gas enter into the processing chamber 110 respectively from the first gas passage 150 and the second gas passage 160.

Figure 2:
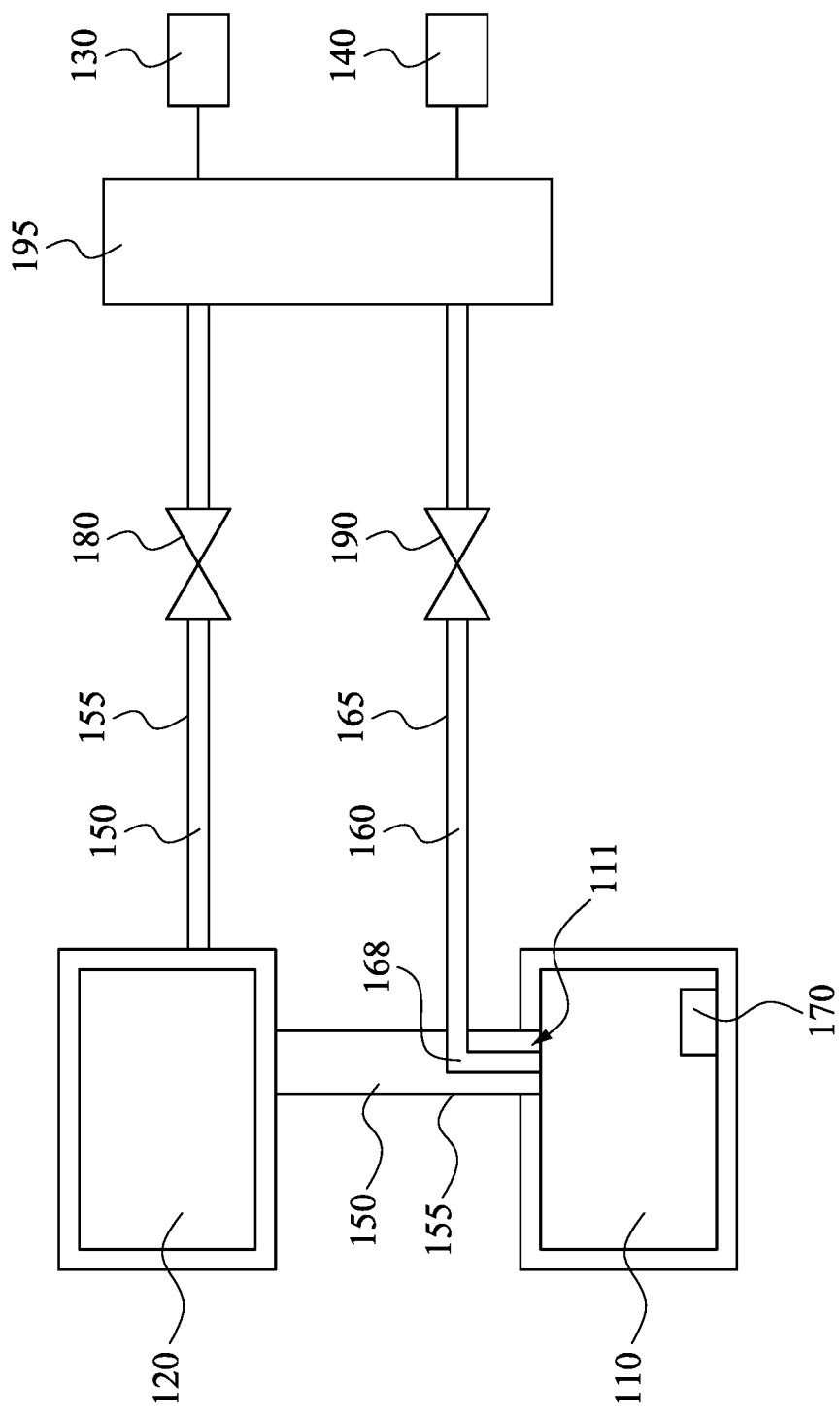
FIG. 2 is a schematic diagram of a chemical vapor deposition (CVD) tool in accordance with some embodiments of the present disclosure.

Reference is made to FIG. 2. FIG. 2 is a schematic diagram of a chemical vapor deposition (CVD) tool 100 in accordance with some embodiments of the present disclosure. As shown in FIG. 2, the second gas passage 160 enters into the portion of the first gas passage 150 between the remote plasma system 120 and the processing chamber 110 first before reaching the gas inlet 111 of the processing chamber 110. In other words, the second duct 165 penetrates into the portion of the first duct 155 between the remote plasma system 120 and the processing chamber 110 first before reaching the gas inlet 111 of the processing chamber 110. The second gas passage 160 has an angle portion 168 that is located in the first duct 155 and overlapping with a central axis of the first duct 155 and is closer to the processing chamber 110 than the angled portion 168 is to the remote plasma system 120.

With reference to the chemical vapor deposition tool 100 having the remote plasma system 120 and the processing chamber 110 as mentioned above, the embodiments of the present disclosure further provide a method for operating the chemical vapor deposition tool 100 having the remote plasma system 120 and the processing chamber 110. The method includes the following steps (it is appreciated that the sequence of the steps and the sub-steps as mentioned below, unless otherwise specified, all can be adjusted according to the actual needs, or even executed at the same time or partially at the same time):

(1) supplying the cleaning gas to the remote plasma system 120;

(2) converting the cleaning gas into the cleaning plasma by the remote plasma system 120;

(3) supplying the cleaning plasma into the processing chamber 110; and (4) supplying the processing gas into the processing chamber 110 without passing through the remote plasma system 120.

In this way, during the operation of the chemical vapor deposition tool 100, the cleaning gas is supplied to the remote plasma system 120 while the processing gas is supplied into the processing chamber 110 without passing through the remote plasma system 120. In other words, the supply of the cleaning gas into the remote plasma system 120 and the supply of the processing gas into the processing chamber 110 are expressly separated. As a result, the flow of the processing gas into the remote plasma system 120 is avoided. Consequently, the probability that the processing gas gets into the remote plasma system 120 and thus causing the existence of residue of the processing gas in the remote plasma system 120 is minimized.

In order to facilitate the process of chemical vapor deposition to the substrate in the processing chamber 110, the method for operating the chemical vapor deposition tool 100 having the remote plasma system 120 and the processing chamber 110 includes:

(5) energizing the processing gas in the processing chamber 110 by releasing an amount of energy in the form of radio frequency to the processing gas in the processing chamber 110.

Furthermore, in order to clean the processing chamber 110 after the process of chemical vapor deposition takes place, the method for operating the chemical vapor deposition tool 100 having the remote plasma system 120 and the processing chamber 110 includes:

(6) removing at least one residue in the processing chamber 110 by the cleaning plasma. In practical applications, the cleaning plasma is converted from the cleaning gas which is corrosive in nature, so as to increase the efficiency to remove the residue.

To be more specific, by adjusting the size of an orifice (not shown) inside the first valve 180, the amount of flow of the cleaning gas through the first gas passage 150 and then to the remote plasma system 120 can be accordingly controlled. Similarly, by adjusting the size of an orifice (not shown) inside the second valve 190, the amount of flow of the processing gas through the second gas passage 160 and then to the processing chamber 110 can be accordingly controlled.

According to various embodiments of the present disclosure, for the chemical vapor deposition tool 100, the first gas passage 150 connects the first gas source 130, the remote plasma system 120 and the processing chamber 110, and the second gas passage 160 connects the second gas source 140 and the processing chamber 110 while bypasses the remote plasma system 120. In other words, the supply of the cleaning gas to the remote plasma system 120 through the first gas passage 150 and the supply of the processing gas to the processing chamber 110 through the second gas passage 160 are expressly separated. As a result, the flow of the processing gas into the remote plasma system 120 is avoided. Consequently, the probability that the processing gas gets into the remote plasma system 120 and thus causing the existence of residue of the processing gas in the remote plasma system 120 is minimized. In this way, there are at least two consequences. Firstly, the probability that the remote plasma system 120 to be contaminated by the processing gas is minimized. Therefore, the working life of the remote plasma system 120 is elongated and thus the maintenance cost for the chemical vapor deposition tool 100 is accordingly reduced. Secondly, in the process of chemical vapor deposition in the processing chamber 110 where both the processing gas and the cleaning gas are utilized, the minimized probability of the existence of residue of the processing gas in the remote plasma system 120 means a minimized probability of the residue of the processing gas unexpectedly getting into the processing chamber 110. Therefore, the process of chemical vapor deposition in the processing chamber 110 is avoided to be affected in a destructive way. As a result, the process of chemical vapor deposition can properly take place in the processing chamber 110 and the contamination of the substrate is avoided. Consequently, the scrap rate of the substrates during the process of chemical vapor deposition is minimized and thus the production cost of the substrates is accordingly decreased.

According to various embodiments of the present disclosure, the chemical vapor deposition tool includes the processing chamber, the remote plasma system, the first gas source, the second gas source, the first gas passage and the second gas passage. The remote plasma system is connected to the processing chamber. The first gas passage connects the first gas source, the remote plasma system and the processing chamber. The second gas passage connects the second gas source and the processing chamber while bypassing the remote plasma system.

According to various embodiments of the present disclosure, the chemical vapor deposition tool includes the first gas source, the first duct, the remote plasma system, the processing chamber, the second gas source and the second duct. The first duct is connected to the first gas source. The remote plasma system is connected to the first duct. The processing chamber is connected to the remote plasma system. The second duct is connected to the second gas source, in which the processing chamber is connected to the second duct.

According to various embodiments of the present disclosure, the method for operating the chemical vapor deposition tool having the remote plasma system and the processing chamber is provided. The method includes supplying the cleaning gas to the remote plasma system, converting the cleaning gas into the cleaning plasma by the remote plasma system, supplying the cleaning plasma into the processing chamber and supplying the processing gas into the processing chamber without passing through the remote plasma system.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chemical vapor deposition (CVD) tool comprising:
a processing chamber including a gas inlet;
a remote plasma system connected to the processing chamber;
a first gas source;
a second gas source;
a gas panel connected between the first gas source and the remote plasma system, and connected between the second gas source and the processing chamber;
a first duct defining a first gas passage, wherein the first duct has a first section connecting the gas panel to the remote plasma system and a second section extending downward straightly in a first direction from the remote plasma system toward the processing chamber; and
a second duct defining a second gas passage, wherein the second duct connects the gas panel to the processing chamber and bypasses the remote plasma system, wherein the first duct and the second duct are connected to the processing chamber through the gas inlet of the processing chamber, and the second duct bypassing the remote plasma system has a first segment penetrating into and extending within the second section of the first duct along a second direction perpendicular to the first direction, and a second segment extending in the first direction and being concentric within the second section of the first duct,
the gas panel being connected to the first and second gas sources and the first and second ducts and being configured to control supply of first gas by the first gas source to the remote plasma system through the first duct and supply of second gas by the second gas source to the processing chamber through the second duct, wherein the first duct and the second duct are configured such that the first gas in the first gas passage and the second gas in the second gas passage do not mix until reaching the processing chamber.

2. The CVD tool of claim 1, wherein the first gas source is a cleaning gas source configured to provide cleaning gas to the remote plasma system through the first section of the first duct; and
   wherein the remote plasma system is configured to convert the cleaning gas into a cleaning plasma and then supply the cleaning plasma to the processing chamber through the section of the first duct.

3. The CVD tool of claim 1, wherein the second gas source is a processing gas source configured to provide processing gas to the processing chamber through the second duct.

4. The CVD tool of claim 3, further comprising:
   a radio frequency generating device disposed in the processing chamber to energize the processing gas.

5. The CVD tool of claim 1, further comprising:
   a first valve configured to control a gas flow through the first section of the first duct.

6. The CVD tool of claim 1, further comprising:
   a second valve configured to control a gas flow through the second segment of the second duct.

7. A chemical vapor deposition (CVD) tool comprising:
   a first gas source;
   a first duct;
   a remote plasma system connected to the first duct;
   a processing chamber connected to the remote plasma system and including a gas inlet, wherein the first duct is connected to the gas inlet of the process chamber;
   a second gas source;
   a second duct bypassing the remote plasma system and extending into the first duct through a sidewall of the first duct to reach the gas inlet of the processing chamber, wherein the second duct has an angled portion located in the first duct and overlapping with a central axis of the first duct; and
   a gas panel connected to the first and second gas sources and the first and second ducts, upstream connected to the remote plasma system through the first duct, and configured to control supply of first gas by the first gas source to the remote plasma system through the first duct and supply of second gas by the second gas source to the processing chamber through the second duct, wherein the first duct and the second duct are configured such that the first gas in the first duct and the second gas in the second duct do not mix until reaching the processing chamber.

8. The CVD tool of claim 7, wherein a fluid passage from the second gas source to the processing chamber through the second duct does not pass through the remote plasma system.

9. The CVD tool of claim 7, wherein the remote plasma system is downstream connected to the first gas source through the first duct.

10. The CVD tool of claim 7, wherein the processing chamber is downstream connected to the remote plasma system.

11. The CVD tool of claim 7, wherein the processing chamber is downstream connected to the second gas source through the second duct.

12. The CVD tool of claim 7, further comprising:
    a first valve connected to the first duct.

13. The CVD tool of claim 7, further comprising:
    a second valve connected to the second duct.

14. A chemical vapor deposition (CVD) tool comprising:
    a first gas source;
    a second gas source;
    a processing chamber including a gas inlet;
    a remote plasma system connected to the processing chamber;
    a gas panel fluidly connected to the first gas source and the second gas source, wherein a first connection between the first gas source and the gas panel is external to a second connection between the second gas source and the gas panel;
    a first duct, wherein the gas panel is upstream connected to the remote plasma system through the first duct; and
    a second duct fluidly connecting the gas panel and the processing chamber and bypassing the remote plasma system, wherein the gas panel is configured to control supply of first gas to the remote plasma system through the first duct and supply of second gas to the processing chamber through the second duct and the first and second ducts are connected to the gas inlet of the processing chamber, wherein the first duct and the second duct are configured such that the first gas in the first duct and the second gas in the second duct do not mix until reaching the processing chamber, the first duct has a diameter extending across a diameter of the second duct, and the second duct has an angled portion located in the first duct, wherein the angled portion is closer to the processing chamber than the angled portion is to the remote plasma system.

15. The CVD tool of claim 14, wherein the second duct has a portion inside the first duct.

16. The CVD tool of claim 1, wherein the gas panel is controlled through a computer program.

17. The CVD tool of claim 16, further comprising a valve configured to control flow of gas through one of the first and second ducts, wherein the computer program is further configured to control the valve.

18. The CVD tool of claim 1, wherein the gas panel is connected between the first duct and the first gas source.

19. The CVD tool of claim 7, wherein the gas panel is connected between the first duct and the first gas source.

20. The CVD tool of claim 17, wherein the gas panel is connected between the valve and the first and second gas sources.

* * * * *